(12) United States Patent
Suzuki et al.

(10) Patent No.: US 6,315,874 B1
(45) Date of Patent: Nov. 13, 2001

(54) METHOD OF DEPOSITING THIN FILM OF METAL OXIDE BY MAGNETRON SPUTTERING APPARATUS

(75) Inventors: Takayuki Suzuki; Hitoshi Nishio, both of Otsu (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/491,183

(22) Filed: Jan. 25, 2000

(30) Foreign Application Priority Data

Jul. 19, 1999 (JP) .................................................. 11-204125

(51) Int. Cl.⁷ .................................................. C23C 14/34
(52) U.S. Cl. .................. 204/192.29; 204/192.22; 204/192.26; 204/298.2
(58) Field of Search .................. 204/192.22, 192.26, 204/192.29, 192.12, 298.2, 298.22, 298.19

(56) References Cited

U.S. PATENT DOCUMENTS 4,221,652 * 9/1980 Kuriyama ........................ 204/298.22
4,622,120 * 11/1986 Gillery ............................ 204/192.26
5,833,815 * 11/1998 Kim et al. ......................... 204/298.2

FOREIGN PATENT DOCUMENTS

| 19701575 | 7/1998 | (DE) . |
| 55-108780 | 8/1980 | (JP) . |
| 06010127 | 1/1994 | (JP) . |
| 08274375 | 10/1996 | (JP) . |
| 9-59772 | * 3/1997 | (JP) . |
| 10158833 | 6/1998 | (JP) . |

* cited by examiner

Primary Examiner—Rodney G. McDonald
(74) Attorney, Agent, or Firm—Hogan & Hartson, L.L.P.

(57) ABSTRACT

A method of depositing a thin film of metal oxide by a magnetron sputtering apparatus with a mobile magnet for creating a magnetic field reciprocating across a film deposition region, is characterized in that the magnet reciprocates no more than twice in depositing a single thin film of metal oxide.

8 Claims, 2 Drawing Sheets

METHOD OF DEPOSITING THIN FILM OF METAL OXIDE BY MAGNETRON SPUTTERING APPARATUS

BACKGROUND OF THE INVENTION

1. Field of the Invention

The present invention relates to film deposition methods by a magnetron sputtering apparatus, and particularly to improvements in methods of depositing a thin film of metal oxide by a magnetron sputtering apparatus with a mobile magnet for creating a magnetic field moving across a film deposition region.

2. Description of the Related Art

A typical example of depositing a thin film of metal oxide by a magnetron sputtering apparatus is deposition of a conductive thin film of metal oxide on a photoelectric conversion layer of semiconductor in a thin-film solar battery. Particularly, a thin-film solar battery for large power to be installed on a roof of a house, the top of a building and the like is required to have a larger area to provide larger power efficiently at low cost.

In depositing a thin film of a large area, a magnetron sputtering apparatus with a mobile magnet is used more preferably than that with fixed magnets, since if the magnetron sputtering apparatus with fixed magnets is used to deposit a thin film on a fixed substrate of a large area, a large number of magnets must be arranged across the entirety of a large film deposition region and thus the apparatus with fixed magnets becomes complex and expensive. Furthermore, even if a large number of magnets are used, it is difficult to create a uniform magnetic field across the entirety of the large film deposition region, so that a target tends to be unevenly consumed and a film tends to be unevenly deposited. Incidentally, there also exists a magnetron sputtering apparatus with fixed magnets, wherein a substrate is moved relative to the fixed magnets, though such an apparatus with fixed magnets requires a large vacuum chamber and a large vacuum pump to move a large substrate in the chamber and also requires a large installation area therefor.

In a magnetron sputtering apparatus with a magnet for creating a magnetic field reciprocating across a film deposition region, conventionally the magnet typically reciprocates across the entirety of the film deposition region multiple times to provide a uniform quality to a film deposited on a fixed substrate. For example, Japanese Patent Laying-Open No. 10-158833 discloses on page 5, paragraph [0034] that a magnet is exemplarily reciprocated eleven times to deposit an ITO (indium-tin oxide) film having a thickness of 60nm.

However, when a magnetron sputtering apparatus with a mobile magnet is used with the magnet being reciprocated multiple times to deposit a transparent conductive oxide (TCO) layer of metal oxide such as ITO, $SnO_2$, or ZnO on a photoelectric conversion layer of semiconductor in a thin-film solar battery, the obtained thin-film solar battery cannot have sufficiently satisfactory characteristics and in particular tends to have a fill factor, as a well-known output characteristic, of insufficient level.

FIGS. 2 and 3 are illustrative, schematic cross sections of thin-film solar batteries each with a TCO layer deposited on a photoelectric conversion layer of semiconductor. In the FIG. 2 thin-film solar battery, successively stacked on a transparent glass substrate 1 are a $SnO_2$ layer as a first electrode layer 2, a photoelectric conversion layer 3 of semiconductor, and a ZnO layer as a second electrode layer 4. Photoelectric conversion layer 3 of semiconductor includes a p-type sublayer 3p, an i-type sublayer 3i, and an n-type sublayer 3n that are stacked successively. Relatively thick i-type sublayer 3i provides photoelectric conversion, while p- and n-type layers 3p and 3n much thinner than i-type sublayer 3i create an electric field. The sublayers may also be formed of either amorphous semiconductor or crystalline semiconductor.

In the FIG. 3 thin-film solar battery also, first electrode layer 2 of $SnO_2$ and photoelectric conversion layer 3 of semiconductor are stacked successively on transparent glass substrate 1. The FIG. 3 thin-film solar battery, however, includes a ZnO layer 4a and an Ag layer 5 that are stacked successively on photoelectric conversion layer 3 of semiconductor, as disclosed in Japanese Patent Laying-Open No. 55-108780. ZnO layer 4a acts to enable a second electrode layer to have a high light reflectivity to provide an improved conversion efficiency, and Ag layer 5 acts as the second electrode layer. Ag layer 5 is preferable as a back electrode layer, since it is highly light reflective and highly conductive. ZnO layer 4a between semiconductor layer 3 and Ag layer 5 is much less thick than the FIG. 2 ZnO electrode layer 4, but it can act to realize an enhanced reflectivity of Ag layer 5 and also prevent Ag atoms from diffusing into semiconductor layer 3.

As such, it is known that a thin-film solar battery preferably includes a TCO layer deposited on a photoelectric conversion layer of semiconductor. As has been described, however, if a magnetron sputtering apparatus with a mobile magnet is used with the magnet being reciprocated multiple times to provide a thin-film solar battery with a TCO layer deposited on a photoelectric conversion layer of semiconductor, the obtained solar battery as shown in FIG. 3 can hardly have satisfactory output characteristics and in particular tends to have a degraded fill factor.

SUMMARY OF THE INVENTION

In view of such issues in the prior art, the present invention contemplates a method of depositing a high-quality thin film of metal oxide by a magnetron sputtering apparatus with a mobile magnet. In particular, the present invention also contemplates a film deposition method capable of improving output characteristics of a thin-film solar battery of a large area including a thin film of metal oxide deposited on a photoelectric conversion layer of semiconductor by magnetron sputtering.

In accordance with the present invention, the method of depositing a thin film of metal oxide by a magnetron sputtering apparatus with a mobile magnet reciprocating to create a magnetic field, is characterized in that the magnet reciprocates no more than twice in depositing a single thin film of metal oxide.

More specifically, the magnet may reciprocate once, or it may do so a half time, i.e., move one way.

The thin film of metal oxide to be formed may be a transparent conductive film of any one of ITO, $SnO_2$ and ZnO.

When the thin film of metal oxide is transmissive to visible light, the thin film of metal oxide can overlie, e.g., on a semiconductor layer included in the thin-film solar battery, with at least an outermost surface layer of the semiconductor layer being an amorphous silicon layer, an amorphous silicon based alloy layer, a crystalline silicon layer or a crystalline silicon based alloy layer.

Furthermore in accordance with the present invention, the method of depositing a thin film of metal oxide by magnetron sputtering is characterized in that the magnet moves at no more than 50 mm/second.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
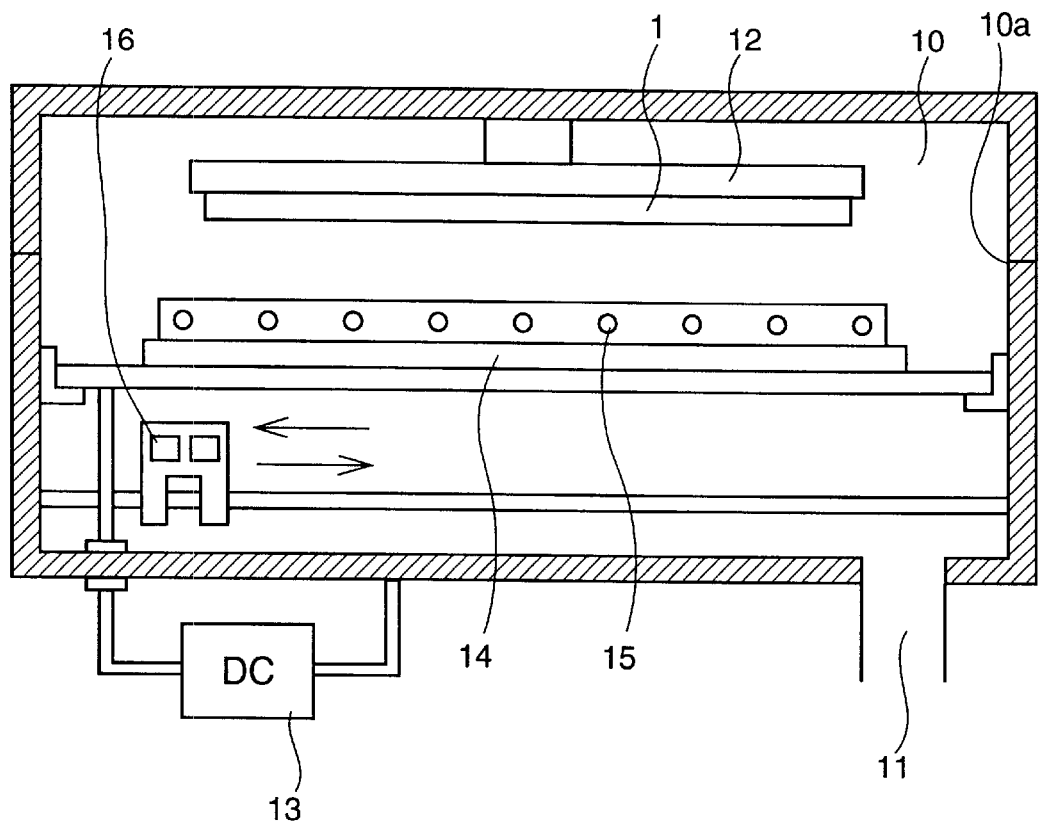
FIG. 1 is a schematic section of an exemplary magnetron sputtering apparatus with a mobile magnet.
Figure 2:
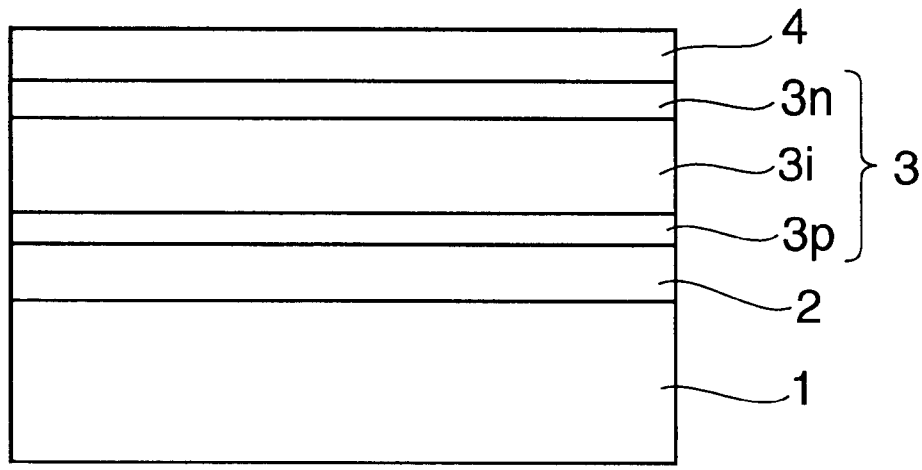
FIG. 2 is a schematic cross section of an exemplary thin-film solar battery.

FIG. 1 is a schematic cross section of an exemplary magnetron sputtering apparatus with a mobile magnet which can be used in a method of depositing a thin film of metal oxide in accordance with an embodiment of the present invention. This sputtering apparatus has a vacuum chamber 10 which can be opened vertically at a vacuum 0-ring seal portion 10a. Vacuum chamber 10 with vacuum 0-ring seal portion 10a cclosed is evacuated by a vacuum pump (not shown) via an evacuation line 11.

In vacuum chamber 10, a substrate 1 on which a film is to be deposited is supported by a substrate holder 12. A target 14 connected to a DC power supply 13 is arranged opposite to substrate 1. Arranged over an upper side of target 14 are a plurality of grounded anode bars 15. Arranged below a lower side of target 14 is a magnet 16 which can reciprocate as indicated by arrows in the figure. A heating means for heating substrate 1 may be provided as desired.

In such a sputtering apparatus, DC power supply 13 applies a DC voltage to target 14 to enable thin Ar gas or the like to cause glow discharge between anode bar 15 and cathode target 14 to create plasma, and magnet 16 acts to confine and densify the plasma in a vicinity of its magnetic field. The plasma densified by the magnetic field sputters target 14, and then sputtered particles adhere to a surface of substrate 1 to deposit a film on substrate 1. During such process, magnet 16 is moved to shift from a partial film deposition region to another to deposit a film across the entire surface of substrate 1 having a large area.

When a sputtering apparatus with a mobile magnet as shown in FIG. 1 is used to deposit a thin film of metal oxide, conventionally magnet 16 is relatively rapidly reciprocated multiple times to deposit the film, as has been described above. With such operation, however, it is difficult to obtain a good-quality thin film of metal oxide. In particular, a thin-film solar battery including a thin film of metal oxide conventionally deposited on a photoelectric conversion layer of semiconductor, can hardly obtain satisfactory output characteristics.

In a film deposition method of the present invention, magnet 16 relatively slowly reciprocates no more than twice or moves one way to deposit a thin film of metal oxide. More specifically, the magnet may reciprocate once, or it may do so a half time, i.e., move one way. The magnet is moved preferably at no more than 50 mm/second, more preferably at no more than 30 mm/second, still more preferably at no more than 20 mm/second, and most preferably at no more than 10 mm/second. Such film deposition method of the present invention can provide a high-quality thin film of metal oxide. In particular, a thin-film solar battery including a thin film of metal oxide deposited on a photoelectric conversion layer of semiconductor in accordance with the method of the present invention, can have improved output characteristics and in particular a significantly improved fill factor.

At present, it is not clear why the present method of depositing a thin film of metal oxide can achieve such improvements as described above. One possible reason for the improvements, however, may be that oxygen atoms and metal atoms are not in a steady constant ratio when sputtered from a partial surface region of the target of metal oxide in the initial stage of sputtering the partial region of the target.

More specifically, it is believed that in the initial stage of sputtering, oxygen atoms having been adsorbed on the surface of the target are also discharged excessively. Since it is believed that oxygen atoms are always adsorbed on the partial regions of the target which are not sputtered, repeated multiple times reciprocation of magnet 16 will cause excessive oxygen atoms to be discharged at the initial stage of sputtering each partial region of the target for each of the reciprocations. As such, it is believed that with a conventional film deposition method, a finally obtained thin film of metal oxide has an inhomogeneous degraded quality and that when a thin film of metal oxide is deposited on a photoelectric conversion layer of semiconductor, excessive discharged oxygen atoms damage the semiconductor layer and then a finally obtained thin-film solar battery has degraded output characteristics.

In contrast, in the film deposition method of the present invention, magnet 16 reciprocates only no more than twice and it is thus believed that the target has each partial sputtered region placed in the initial sputtering condition less frequently and that excessive oxygen atoms are discharged less frequently. This may result in a thin film of metal oxide having a uniform, good quality, and also a semiconductor layer being less damaged when such a thin film of metal oxide is deposited on a photoelectric conversion layer of semiconductor, and hence an obtained thin-film solar battery having improved output characteristics.

EXAMPLE

Figure 3:
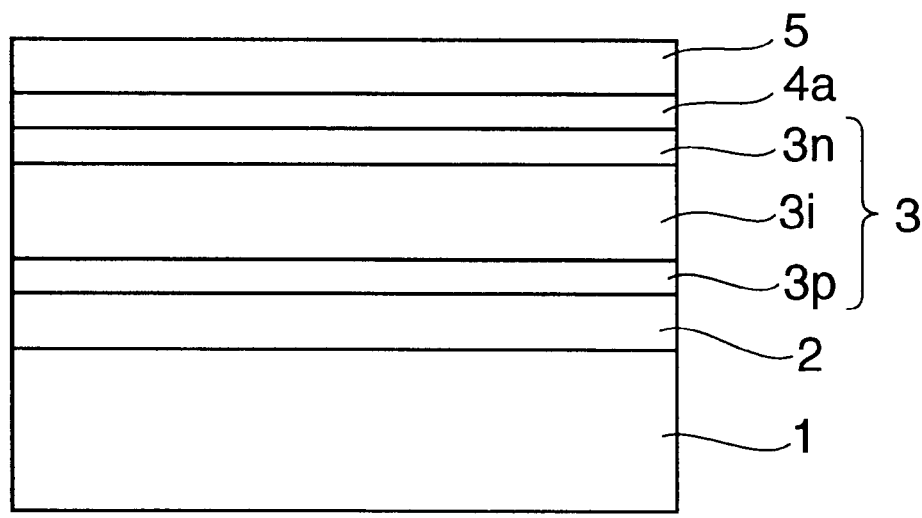
FIG. 3 is a schematic cross section of another exemplary thin-film solar battery.

One specific example of the film deposition method of the present invention will now be described together with a comparative example. In the present example, a magnetron sputtering apparatus with a mobile magnet as shown in FIG. 1 was used to fabricate a well-known common amorphous thin-film solar battery as shown in FIG. 3.

Initially, a glass substrate 1 was prepared with a transparent conductive layer 2 of $SnO_2$ formed on a major surface thereof. Such glass substrate 1 with $SnO_2$ layer 2 is commercially available. Glass substrate 1 had an area of approximately 45 cm ×45cm. Well-known plasma chemical vapor deposition (CVD) and laser scribing were employed to form on $SnO_2$ layer 2 a well-known common photoelectric conversion layer 3 of semiconductor to be integrated. It is noted that an integrated thin-film solar battery is described, e.g., in Japanese Patent Laying-Open No. 61-210681.

Two glass substrates 1 each with $SnO_2$ layer 2 and photoelectric conversion layer 3 of semiconductor stacked thereon were arranged on substrate holder 12 in a magnetron sputtering apparatus with a mobile magnet as shown in FIG. 1, serially in a direction in which the magnet moves. The present example did not employ a heating means for heating the substrates. After these substrates were removed from the plasma CVD apparatus and placed in the sputtering apparatus, the substrates were immediately subjected to sputtering. It should be noted that if a substrate has a high temperature, it may be placed in the sputtering apparatus for some time and thus cooled before it is subjected to sputtering. In the sputtering, magnet 16 moved a distance of 1200 mm, i.e., a film can be deposited in an area having a length of 1200 mm.

Under such conditions, magnet 16 reciprocated a half time, i.e., moved only one way in two minutes and twenty four seconds to form a transparent conductive layer 4a of ZnO having a thickness of 60 nm on photoelectric conversion layer 3 of semiconductor. Formed on $SnO_2$ layer 4a was a common Ag layer 5. Finally, ZnO layer 4a and Ag layer 5 were laser-scribed in a predetermined pattern to provide an integrated thin-film solar battery. The obtained solar battery was measured for output characteristics and has been found to have a fill factor of no less than 70%.

There was also prepared a thin-film solar battery as a comparative example, similar to the thin-film solar battery of the above example. The comparative example was distinguished from the above example only in that ZnO layer 4 of 60 nm in thickness was formed while magnet 16 being reciprocated 12 times in two minutes and twenty four seconds. The thin-film solar battery thus obtained as a comparative example was measured for output characteristics and was found to have a fill factor of no more than 60%.

From the above example and comparative example, it is apparent that the thin-film solar battery including a ZnO layer deposited according to the film deposition method of the present invention has better output characteristics than that including a ZnO layer deposited according to a film deposition method of conventional art. This may be because the film deposition method of the present invention can provide for a good quality ZnO layer and also less damages the photoelectric conversion layer of semiconductor underlying the ZnO layer.

Thus the present invention can provide for a method of depositing a good-quality thin film of metal oxide by a magnetron sputtering apparatus with a mobile magnet. In particular, the present invention can provide for a film deposition method capable of improving output characteristics of a solar battery including a thin film of metal oxide deposited on a photoelectric conversion layer of semiconductor by magnetron sputtering.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of depositing a thin film of metal oxide by a magnetron sputtering apparatus with a mobile magnet for creating a magnetic field reciprocating across a film deposition region, wherein said magnet reciprocates no more than twice in depositing a single thin film of metal oxide on a substrate fixedly secured inside the magnetron sputtering apparatus.

2. The method of claim 1, wherein said magnet reciprocates once in depositing said single thin film of metal oxide.

3. The method of claim 1, wherein said magnet reciprocates a half time by moving one way in depositing said single thin film of metal oxide.

4. The method of claim 1, wherein said thin film of metal oxide is a transparent conductive film formed of any of ITO, $SnO_2$ and ZnO.

5. The method of claim 4, wherein said thin film of metal oxide is a transparent conductive film formed of ZnO.

6. The method of claim 1, wherein said thin film of metal oxide is transmissive to visible light, and said thin film of metal oxide overlies a semiconductor layer with at least an outermost surface layer thereof formed of either one of an amorphous silicon layer and an amorphous silicon based alloy layer.

7. The method of claim 1, wherein said thin film of metal oxide is transmissive to visible light, and said thin film of metal oxide overlies a semiconductor layer with at least an outermost surface layer thereof formed of either one of a crystalline silicon layer and a crystalline silicon based alloy layer.

8. A method of depositing a thin film of metal oxide by a magnetron sputtering apparatus with a mobile magnet reciprocating no more than twice for creating a magnetic field across a film deposition region, wherein said magnet moves at a speed of no more than 50 mm/second to deposit the thin film of metal oxide on a substrate fixedly secured inside the magnetron sputtering apparatus.

* * * * *